(12) United States Patent
Hung et al.

(10) Patent No.: US 9,564,371 B2
(45) Date of Patent: Feb. 7, 2017

(54) METHOD FOR FORMING SEMICONDUCTOR DEVICE

(71) Applicant: UNITED MICROELECTRONICS CORP., Hsin-Chu (TW)

(72) Inventors: Ching-Wen Hung, Tainan (TW); Tsung-Hung Chang, Yunlin County (TW); Jia-Rong Wu, Kaohsiung (TW); Ching-Ling Lin, Kaohsiung (TW); Yi-Hui Lee, Taipei (TW); Chih-Sen Huang, Tainan (TW); Yi-Wei Chen, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/514,374

(22) Filed: Oct. 14, 2014

(65) Prior Publication Data

US 2016/0104646 A1    Apr. 14, 2016

(51) Int. Cl.
*H01L 21/8234* (2006.01)
*H01L 21/768* (2006.01)
*H01L 21/311* (2006.01)

(52) U.S. Cl.
CPC . *H01L 21/823475* (2013.01); *H01L 21/31144* (2013.01); *H01L 21/76816* (2013.01); *H01L 21/76897* (2013.01); *H01L 21/823431* (2013.01)

(58) Field of Classification Search
None
See application file for complete search history.

(56) References Cited

U.S. PATENT DOCUMENTS

| 8,629,064 | B2 | 1/2014 | Li |
| 2013/0023118 | A1* | 1/2013 | Jeong ................ H01L 21/31144 438/672 |
| 2014/0199837 | A1* | 7/2014 | Hung et al. .................... 438/675 |
| 2014/0346605 | A1* | 11/2014 | Zeitzoff et al. ................ 257/368 |
| 2015/0104913 | A1* | 4/2015 | Liu et al. ....................... 438/229 |

* cited by examiner

*Primary Examiner* — Shaun Campbell
*Assistant Examiner* — Aneta Cieslewicz
(74) *Attorney, Agent, or Firm* — Winston Hsu; Scott Margo

(57) ABSTRACT

A manufacturing method for forming a semiconductor device includes: first, a substrate is provided, a fin structure is formed on the substrate, and a plurality of gate structures are formed on the fin structure, next, a hard mask layer and a first photoresist layer are formed on the fin structure, an first etching process is then performed on the first photoresist layer, afterwards, a plurality of patterned photoresist layers are formed on the remaining first photoresist layer and the remaining hard mask layer, where each patterned photoresist layer is disposed right above each gate structure, and the width of each patterned photoresist is larger than the width of each gate structure, and the patterned photoresist layer is used as a hard mask to perform an second etching process to form a plurality of second trenches.

16 Claims, 5 Drawing Sheets

METHOD FOR FORMING SEMICONDUCTOR DEVICE

BACKGROUND OF THE INVENTION

1. Field of the Invention

The present invention generally relates to the field of patterned structures, and more particularly, to a method for fabricating a patterned structure such as slot contacts in a semiconductor device.

2. Description of the Prior Art

Integrated circuits (IC) are made of devices and interconnections, which are formed through patterned features in different layers. During the fabrication process of ICs, the photolithography is an essential technique. The photolithography is used to form designed patterns, such as implantation patterns or layout patterns, on at least a photomask, and then to precisely transfer such patterns to a photoresist layer by exposure and development steps. Finally, by performing several semiconductor processes such as etching process, ion implantation, deposition and so forth, complicated and sophisticated IC structures can be obtained.

With the continuous miniaturization of semiconductor devices and the remarkable advance in fabrication techniques of semiconductor devices, the conventional lithography process meets its limitation due to printability and manufacturability problems. To meet the requirements of device design rules which continue to push the resolution limits of existing processes and tooling, a double patterning technique (DPT) has been developed and taken as one of the most promising lithographic technologies for 32 nanometer (nm) node and 22 nm node patterning, since it can increase the half-pitch resolution up to twice higher by using current infrastructures. For example, the litho-etch-litho-etch (LELE) approach, also called 2P2E, is one of the most common DPTs for fabricating patterns in a semiconductor device. When a 2P2E approach is carried out, a target layer, such as a polysilicon layer, located on a substrate will first be covered with an etch mask in order to define regions for forming patterns. Then, a plurality of stripe patterned target layers, which are parallel to each other, are formed by performing the first litho-etch process. Finally, a second litho-etch process is performed in order to cut out or split a portion of the stripe patterned target layers. Through the preceding processes, structures with relatively high resolution can be obtained. However, there are still some drawbacks that need to be overcome. For example, when a misalignment issue occurs, the position shifting may occur during the etching process, and the size of each stripe patterned target layer cannot be controlled well. If the stripe patterned target layer becomes too small, it can be deemed as an "undesired dummy pattern", which cannot be used as a normal component, therefore influencing the performance and the reliability of the semiconductor device.

Accordingly, in order to overcome the above-mentioned drawbacks, there is a need to provide a modified method of fabricating a patterned structure with improved reliability.

SUMMARY OF THE INVENTION

The present invention provides a manufacturing method for forming a semiconductor device, at least comprising the following steps: first, a substrate is provided, a fin structure is formed on the substrate, and a plurality of gate structures are formed on the fin structure, next, a hard mask layer and a first photoresist layer are formed on the fin structure, an first etching process is then performed on the first photoresist layer, to form at least one first trench in the first photoresist layer and in the hard mask layer, so as to define a region, afterwards, a plurality of patterned photoresist layers are formed on the remaining first photoresist layer and on the remaining hard mask layer, wherein each patterned photoresist layer is disposed right above each gate structure, and the width of each patterned photoresist is larger than the width of each gate structure, and the patterned photoresist layer is used as a hard mask to perform an second etching process to form a plurality of second trenches, wherein the second trenches are only disposed within the region.

The present invention provides a method for forming a semiconductor device, the feature of the method is that after the first etching process is performed, in order to avoid forming the undesired dummy patterns caused by the misalignment issue, further comprising forming a plurality of patterned photoresist layer disposed corresponds to the position of each gate structure. Especially, for each gate structure, there is one patterned photoresist layer disposed right above the gate structure, and the width of the patterned photoresist layer is larger than the width of each gate structure. Therefore, even though the misalignment issue occurs, the "undesired dummy pattern" will not be formed during the manufacturing process, so that the reliability of the semiconductor device can be improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
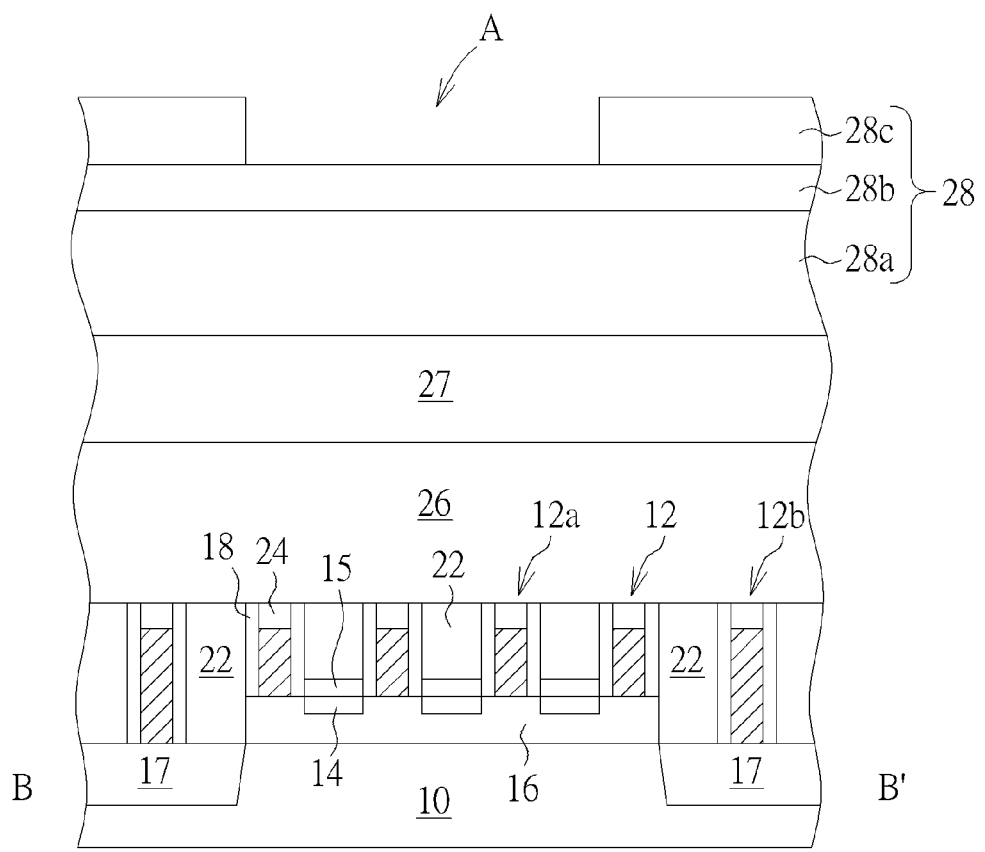
FIGS. 1~6 are schematic cross section diagrams illustrating a manufacturing method of the semiconductor device according to a first preferred embodiment of the present invention.

Please refer to FIGS. 1~6, which are schematic cross section diagrams illustrating a manufacturing method of the semiconductor device according to a first preferred embodiment of the present invention. And please further refer to FIGS. 7~9, which are top-view diagrams illustrating the semiconductor device according to a first preferred embodiment of the present invention. As shown in FIG. 1 and FIG. 7, FIG. 1 is the cross section diagram according to the cross-line B-B' in FIG. 7. A substrate 10 is first provided, wherein the substrate 10 comprises a plurality of gate structures 12 arranged along a first direction, and at least one fin structure 16 arranged along a second direction, where the gate structures 12 cross over the fin structure 16. Preferably, the first direction and second direction are orthogonal, so each fin structure 16 and each gate structure 12 are arranged orthogonally, but not limited thereto. When viewed in top view, as shown in FIG. 7, the gate structures 12 are preferably stripe-shaped, and arranged parallel to each other, but not limited thereto. A plurality of source/drain regions (S/D region) 14 are disposed on two sides of the gate structure 12, and disposed in the fin structure 16. In this embodiment, the gate structure 12 preferably comprises metal materials, and the S/D regions 14 can be formed on the fin structure 16 disposed on two sides of the gate structure 12. The method of the present invention further comprises forming at least one shallow trench isolation (STI) 17 in the substrate 10 surrounding each fin structure 16, to isolate the electric elements on the substrate 10 from each other. In this embodiment, the gate structure 12 may cross the fin structure 16 disposed on the substrate 10 (such as the gate structure 12a shown in FIG. 1), or be disposed on the STI 17 (such as the gate structure 12b shown in FIG. 1) and be used as a passing gate, or may be disposed on the edge of the fin structure 16 to protect the fin structure 16 (not shown in FIG. 1), and be used as a dummy gate.

In addition, the method of the present invention further comprises selectively forming an epitaxial layer 15 on the S/D region 14. Afterwards, a spacer 18 and a contact etching stop layer (CESL) (not shown) may be formed on two sides of the gate structure 12. An interlayer dielectric (ILD) 22 is then formed on the substrate 10, disposed between each gate structure 12, and a planarization process is then performed, such as a chemical mechanical polishing (CMP), to have the top surface of the gate structure 12 and the top surface of the ILD 22 on the same level. It is noteworthy that in this embodiment, an etching process is performed after the gate structure 12 is completed, to remove parts of the gate structure 12, and a hard mask 24 is then selectively formed to replace the upper portion of the gate structure 12. Another planarization process is then performed to remove the extra hard mask 24. In other words, in the present embodiment, a hard mask 24 is disposed on the top of the gate structure 12, and the top surface of the hard mask 24 and the top surface of the ILD 22 are on the same level. Besides, since the hard mask 24 replaces some top portion of the gate structure 12, the hard mask 24 is therefore disposed only on the gate structure 12, and disposed between the spacers 18. In addition, since parts of the spacer 18 and parts of the CESL are removed during another planarization process, the spacer 18 and the CESL have a truncated top surface. In the present embodiment, the spacer 18, the CESL and the hard mask 24 mainly comprise silicon nitride, and the ILD 22 mainly comprises silicon oxide, but not limited thereto. These elements and the manufacturing methods thereof are well known to persons of ordinary skill in the art and the details will not be described here.

Afterwards, please still refer to FIG. 1. Another ILD 26 and a hard mask layer 27 are then formed on the ILD 22, and a first photoresist layer 28 is then formed on the hard mask layer 27. According to the preferred embodiment, the hard mask layer 27 mainly comprise titanium nitride, the first photoresist layer 28 sequentially includes an organic dielectric layer (ODL) 28a, a silicon-containing hard mask bottom anti-reflecting coating (SHB) 28b and a photoresist (PR) layer 28c. In short, the first photoresist layer 28 is a tri-layer structure consisting of an ODL/SHB/PR structure, but not limited thereto. For example, the first photoresist layer 28 may be a bi-layer structure. Afterwards, in order to define the region that includes the needed components such as gate structures or parts of the fin structures, an exposure process and a developing process is performed to pattern the photoresist layer 28c, and an region A is then defined in the photoresist layer 28c. Please refer to FIG. 7, when viewed in top view, the region A overlaps parts of the fin structures 16 and parts of the gate structure 12. In other words, the other regions that are out of the region A can be deemed as the "undesired region" and be covered by the photoresist layer, and the following process, such as some photo-etching processes or some gap-fill processes will be performed only within the region A but not performed within the undesired region, so that the needed components will only be formed within the region A.

Figure 2:
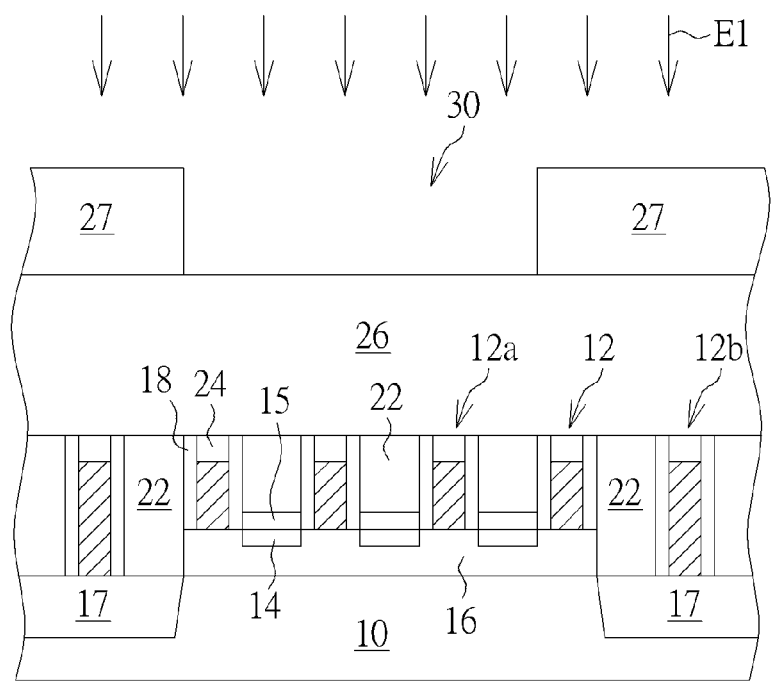

Afterwards, please refer to FIG. 2, at least one etching process E1 is performed to transfer the pattern to other layers disposed below, wherein the etching process E1 etches the SHB 28b, the ODL 28a and the hard mask layer 27 in sequence, until exposing the ILD 26. It is noteworthy that the when viewed in cross section view, as shown in FIG. 2, an opening 30 is formed in the hard mask layer 27, and when viewed in top view, as shown in FIG. 7, the range of the opening 30 is same as the range of the region A mentioned above. In other words, the needed components such as slot contacts which are formed in the following steps, will only exist within the region A, and other undesired components out of the region A will be deemed as the "undesired components" during the first etching process E1. The etching process E1 of the present invention preferably uses etching gases, which may comprise per fluorocarbon gases, such as tetrafluoromethane ($CF_4$), fluoroform ($CHF_3$), hexafluorobutadiene ($C_4F_6$), and further comprises oxygen and argon, but not limited thereto. The etching process may also comprise a wet-etching process.

Figure 3:
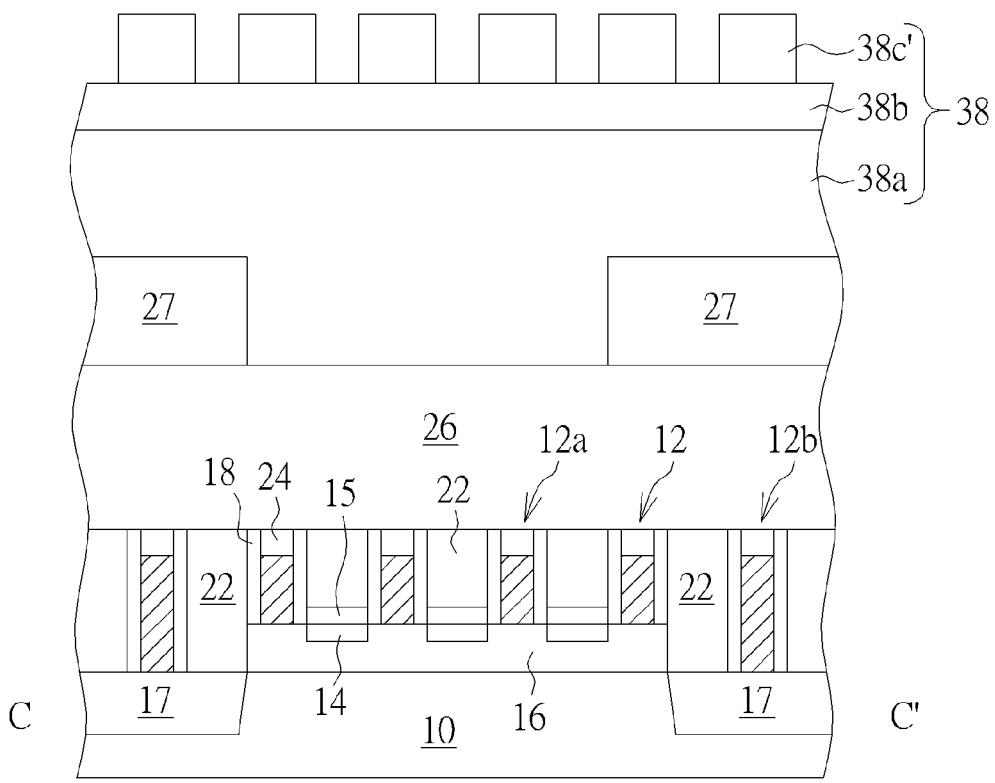
Figure 8:
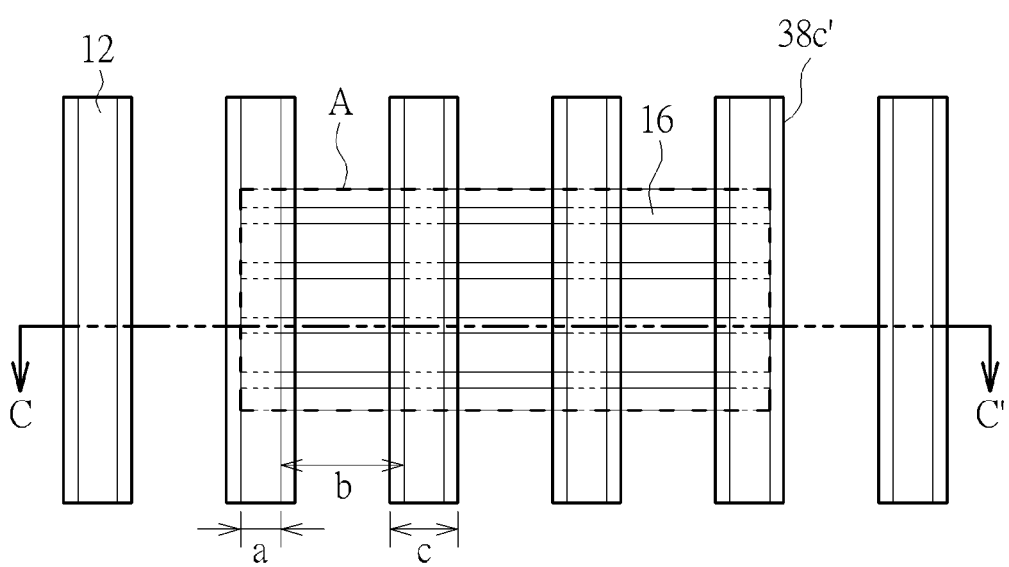

Next, refer to FIG. 3 and FIG. 8. FIG. 3 is the cross section diagram according to the cross-line C-C' in FIG. 8. A second photoresist layer 38 is then formed on the ILD 26 and the remaining hard mask layer 27, wherein the material of the second photoresist layer 38 may be the same as the material of the first photoresist layer 28, comprising an organic dielectric layer (ODL) 38a, a silicon-containing hard mask bottom anti-reflecting coating (SHB) 38b and a photoresist layer 38c. Afterwards, in order to form the needed components such as slot contacts between each gate structure 12, an exposure process and a developing process is performed to pattern the photoresist layer 38c. After the photoresist layer 38c is patterned, a plurality of patterned photoresist layers 38c' is formed on the SHB 38b. It is noteworthy that in the present invention, the position of each patterned photoresist layer 38c' corresponds to the position of each gate structure 12. More precisely, for each gate structure 12, there is one patterned photoresist layer 38c' disposed right above the gate structure 12, and the width of the patterned photoresist layer 38c' is larger than the width of each gate structure 12. Please refer to FIG. 8, which is the schematic diagram showing the top view structure of the semiconductor device after the patterned photoresist layer 38c' is formed, in order to describe the relationship between the size of each gate structure and the size of each patterned photoresist layer 38c' more clearly, some components such as the ILD or the source/drain region will be omitted in FIG. 8. As shown in FIG. 8, since the width of each patterned photoresist layer 38c' is larger than the width of each gate structure 12, and each patterned photoresist layer 38c' disposed right above the gate structure 12, when viewed in top view, the area of each patterned photoresist layer 38c' totally overlaps the area of each gate structure 12. In the present invention, the size and the position of each patterned photoresist layer 38c' will be changed depending on the size and the position of each gate structure 12, so each gate structure 12 will be overlapped by a patterned photoresist layer 38c' respectively. In this embodiment of the present invention, since the gate structure are stripe-shaped structures, and arranged parallel to each other, the patterned photoresist layer are stripe-shaped structure and arranged parallel to each other too. The width of each gate structure (labeled as "a" in FIG. 8) is 15 nm, the space between every two adjacent gate structures (labeled as "b" in FIG. 8) is 65 nm, and the width of each patterned photoresist layer (labeled as "c" in FIG. 8) is 45 nm, preferably between 30 nm~60 nm. Therefore, the ratio of the width of each patterned photoresist layer divided by the width of each gate structure (c/a) is preferably between 2~4, and the ratio of the width of each patterned photoresist layer divided by the space between each two adjacent gate structures (c/b) is between 0.5~1. However, it can be understood that the size of the gate structure and the space between two adjacent gate structures can be adjusted according to actual requirements, the width range or the ratio mentioned above is just one preferred embodiment of the present invention, but the present invention is not limited thereto.

Figure 4:
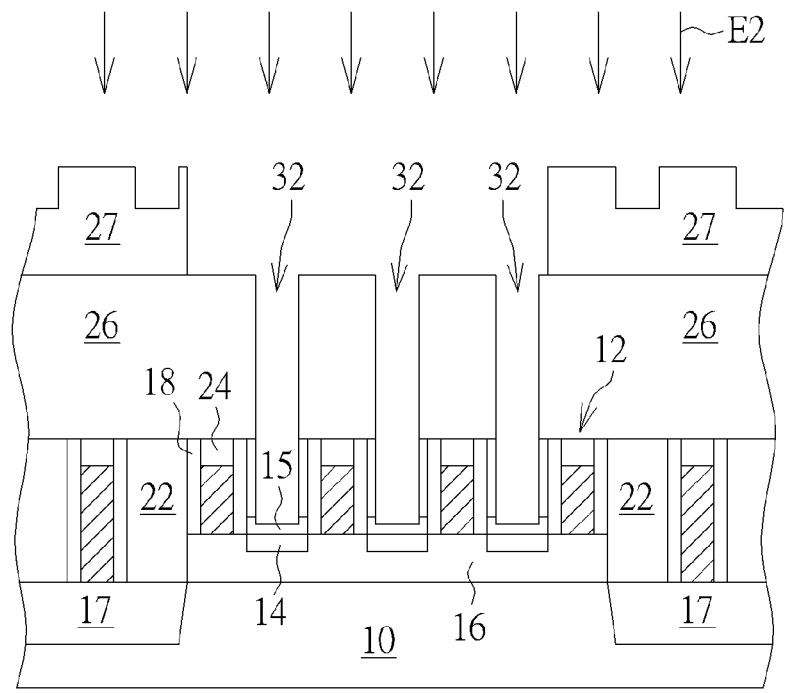

Next, a reverse contact process is then performed, the reverse contact process includes the following steps: as shown in FIG. 4, an etching process E2 is performed, wherein the etching process E2 etches the SHB 38b, the ODL 38a, the hard mask layer 27, the ILD 26, the ILD 22 and the CESL in sequence, so as to form a plurality of trenches 32 in the ILD 22 and in the ILD 26. Therefore, parts of the epitaxial layer 15 is exposed by the trenches 32. Besides, parts of the etched hard mask layer 27 still remain on the ILD 26. Similar to the etching process E1 mentioned above, the etching process E2 preferably uses etching gases, which may comprise per fluorocarbon gases, such as tetrafluoromethane ($CF_4$), fluoroform ($CHF_3$), hexafluorobutadiene ($C_4F_6$), and further comprises oxygen and argon, but not limited thereto. The etching process E2 may also comprise a wet-etching process. It is noteworthy that since the patterned photoresist layer 38c' totally overlaps the gate structure 12, during the etching process E2, each patterned photoresist layer 38c' is used as a hard mask to protect the layers disposed below. Therefore, only the layer which is not overlapped with the each patterned photoresist layer 38c' will be etched. And after the etching process E2 is performed, each trench 32 is disposed between two adjacent gate structures 12, but does not directly contact the gate structure 12. In addition, when viewed in top view, each trench 32 is stripe-shaped and arranged parallel to each gate structure 12.

Figure 5:
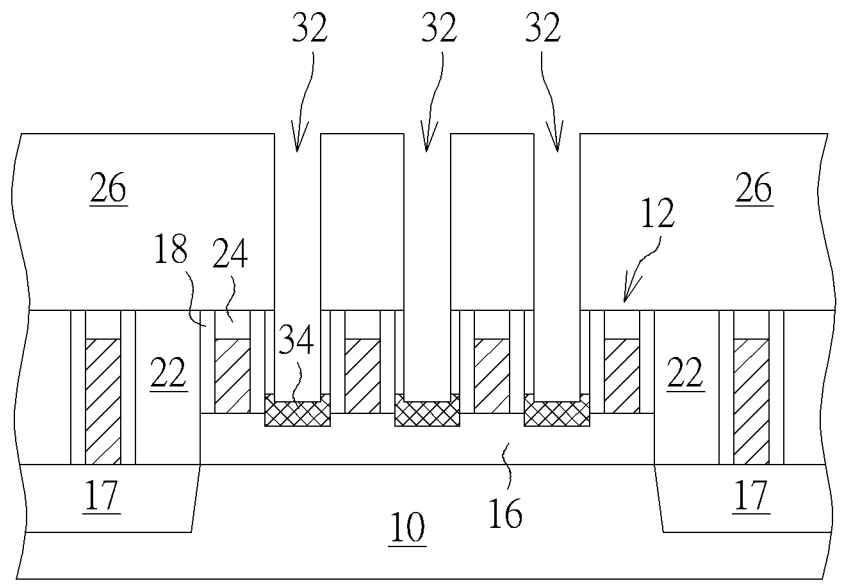

As shown in FIG. 5, after the remaining hard mask layer 27 is removed, a salicide (self-aligned silicide) process is performed on the epitaxial layer 15 to form a salicide layer 34 on the bottom of the trenches 32. The salicide process mainly comprises filling a metal layer (not shown) in each trench 32, and a thermal process is then performed to form a salicide layer 34 on the interface between the metal layer and the silicon-containing surface. Afterwards, the metal layer disposed in the trenches 32 is then removed. It is noteworthy that since the salicide layer 34 is only formed on the silicon-containing surface, it may therefore be formed on the fin structure 16, on the epitaxial layer 15 or on the substrate 10, but will not be formed on the STI 17.

Figure 6:
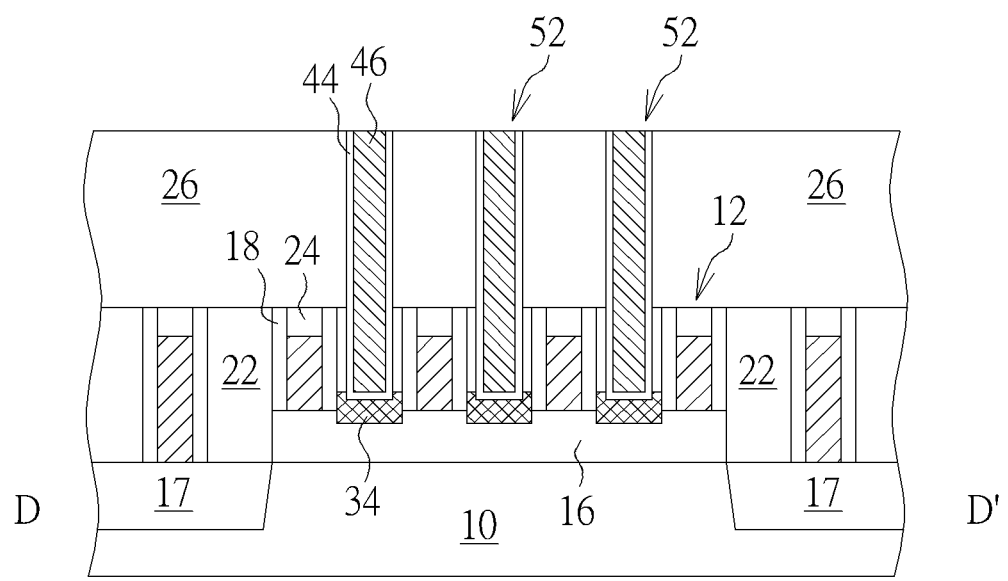
Figure 7:
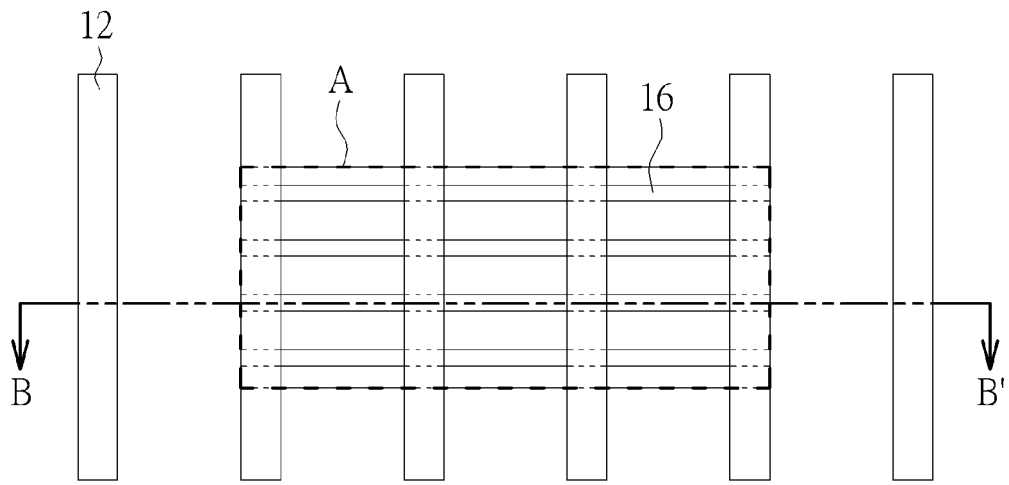
FIGS. 7~9 are top-view diagrams illustrating the semiconductor device according to a first preferred embodiment of the present invention.
Figure 9:
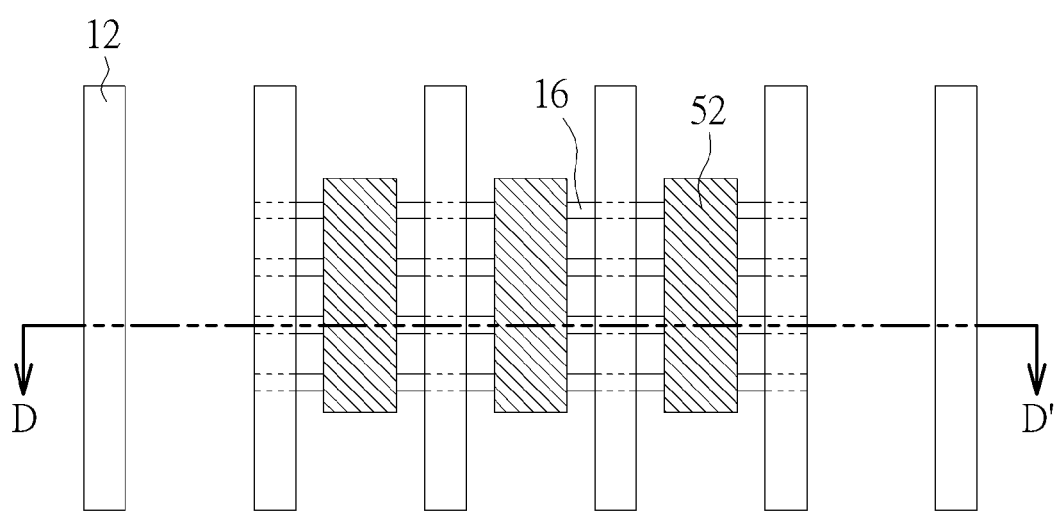

Please refer to FIG. 6 and FIG. 9, FIG. 6 is the cross section diagram according to the cross-line D-D' in FIG. 9. As shown in FIG. 6, a barrier layer 44 and a conductive layer 46 are filled in each trench 32 simultaneously, wherein the barrier layer 44 may comprise titanium nitride (TiN), tantalum nitride (TaN) or Ti/TiN multiple barrier layers to improve the adhesivity between the inner surface of each trench 32 and the conductive layer formed in the following steps. The conductive layer 46 preferably comprises tungsten (W) that has better gap fill performances. A planarization process is then performed to remove the extra barrier layer and the conductive layer disposed on the top surface of the ILD 26 to form a plurality of contact structures 52 in the ILD 22 and in the ILD 26. In addition, since the contact structures 52 is filled by the conductive layer 46, each contact structure 52 is a monolithically formed structure. FIG. 9 is the schematic diagram showing the top view structure of the semiconductor device after the contact structure 52 is formed. As shown in FIGS. 5~6 and FIG. 9, since the trenches 32 are formed between every two adjacent gate structures 12, and do not directly contact the gate structure 12, after each trench 32 is filled by the conductive layer 46, and the contact structure 52 is completed, each contact structure 52 will not directly contact the gate structure 12, either. It is noteworthy that since the top portion of each gate structure 12 is protected by the ILD 26, so in the present invention, the step for forming the hard mask 24 mentioned above can be omitted. In other words, the hard mask 24 is selectively formed in the present invention.

In summary, the present invention provides a method for forming a semiconductor device, the feature of the method is that after the first etching process is performed, in order to avoid forming the undesired dummy patterns caused by the misalignment issue, further comprising forming a plurality of patterned photoresist layer disposed corresponding to the position of each gate structure. Especially, for each gate structure, there is one patterned photoresist layer disposed right above the gate structure, and the width of the patterned photoresist layer is larger than the width of each gate structure. Therefore, even though the misalignment issue occurs, the "undesired dummy pattern" will not be formed during the manufacturing process, so that the reliability of the semiconductor device can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method for forming a semiconductor device, at least comprising the following steps:
   providing a substrate, a fin structure is formed on the substrate, and a plurality of gate structures are formed on the fin structure;
   forming an interlayer dielectric on the gate structures;
   forming a hard mask layer and a first photoresist layer on the interlayer dielectric;
   performing a first etching process on the first photoresist layer, to form at least one first trench in the first photoresist layer and in the hard mask layer, so as to define a region, wherein the region is overlapping the fin structures when the semiconductor device is viewed from the top view;
   forming a plurality of patterned photoresist layers on the remaining hard mask layer, wherein each patterned photoresist layer is disposed right above each gate structure, and a width of each patterned photoresist is larger than a width of each gate structure, in addition, an area of the each patterned photoresist layer of the plurality of the patterned photoresist layers totally overlaps an area of each corresponding gate structure from the plurality of the gate structures when viewed in top view; and using the remaining hard mask layer and the plurality of patterned photoresist layer as a second hard mask to perform a second etching process to form a plurality of second trenches, wherein the plurality of second trenches are only disposed within the region, and each second trench at least partially overlaps the width of the first trench.

2. The method of claim 1, wherein the plurality of gate structures are stripe-shaped and arranged parallel to each other.

3. The method of claim 2, wherein each fin structure and each gate structure are arranged orthogonally.

4. The method of claim 1, wherein a ratio of the width of each patterned photoresist layer divided by the width of each gate structure is between 2~4.

5. The method of claim 1, wherein a ratio of the width of each patterned photoresist layer divided by a space between each two adjacent gate structures is between 0.5~1.

6. The method of claim 1, wherein the first photoresist layer is a multiple layer structure.

7. The method of claim 1, after the first etching process is performed, further comprising forming a second photoresist layer on the remaining hard mask layer, and the second photoresist layer is a multiple layer structure.

8. The method of claim 1, further comprising forming a silicide layer in each second trench.

9. The method of claim 1, further comprising filling a conductive layer in each second trench.

10. The method of claim 1, wherein each second trench is arranged parallel to each gate structure.

11. The method of claim 1, further comprising forming an epitaxial layer on the fin structure, wherein each second trench exposes the epitaxial layer.

12. The method of claim 1, wherein each second trench does not contact each gate structure directly.

13. The method of claim 1, further comprising forming a first interlayer dielectric between each gate structure.

14. The method of claim 1, further comprising forming a second interlayer dielectric between the plurality of gate structures and the hard mask layer.

15. The method of claim 1, wherein the at least one first trench exposes the interlayer dielectric.

16. The method of claim 1, wherein each second trench is not disposed right above each gate structure.

* * * * *